United States Patent [19]

Saneski

[11] Patent Number: 4,575,646
[45] Date of Patent: Mar. 11, 1986

[54] HIGH-SPEED BUFFER ARRANGEMENT WITH NO DELAY DISTORTION

[75] Inventor: Steven P. Saneski, Lake Hiawatha, N.J.

[73] Assignee: AT&T Bell Laboratories, Murray Hill, N.J.

[21] Appl. No.: 500,419

[22] Filed: Jun. 2, 1983

[51] Int. Cl.$^4$ .................. H03K 19/003; H03K 19/092; H03K 5/01
[52] U.S. Cl. .................... 307/443; 307/475; 307/601; 307/602; 307/603
[58] Field of Search ............... 307/443, 440, 445, 446, 307/475, 265, 268, 591, 601–603

[56] References Cited

U.S. PATENT DOCUMENTS

| | | | |
|---|---|---|---|
| 3,909,633 | 9/1975 | Hall | 307/268 |
| 3,925,689 | 12/1975 | Rubenstein | 307/260 |
| 4,247,921 | 1/1981 | Itoh et al. | 307/475 X |
| 4,305,009 | 12/1981 | Miyagawa et al. | 307/264 |
| 4,314,166 | 2/1982 | Bismarck | 307/475 |
| 4,412,335 | 10/1983 | Froment et al. | 307/443 X |

Primary Examiner—Larry N. Anagnos
Attorney, Agent, or Firm—Stephen M. Gurey; Volker R. Ulbrich

[57] ABSTRACT

A buffer arrangement on an integrated circuit is disclosed which translates the voltage levels of logic signals without distortion. Generally, signal distortion results from the difference between the low-to-high propagation delay and the high-to-low propagation delay through an individual buffer. The arrangement includes two buffers (33, 36) having unknown distorting characteristics, arranged in series-inverting pairs (31, 33; 35, 36). The first buffer (33) generates a predistorted signal from the signal to be translated, which has a delay at each transition due to either the high-to-low or low-to-high propagation delay of that buffer. By inverting (35) and redistorting the predistorted signal through a second buffer (36), each transition in the signal at the output thereof is further delayed due to a propagation delay opposite in type to that which that same transition was delayed by the first buffer. Each transition in the output signal has a total delay equal to the sum of the high-to-low propagation delay of one buffer plus the low-to-high propagation delay of the other buffer. When both buffers are of the same type on the same integrated circuit, their distortion characteristics are equivalent; and each transition in the output signal is uniformly delayed so that the output signal is faithful in shape to the input signal.

5 Claims, 8 Drawing Figures

HIGH-SPEED BUFFER ARRANGEMENT WITH NO DELAY DISTORTION

BACKGROUND OF THE INVENTION

This invention relates to the buffer interface circuits on an integrated circuit (IC) which, at the inputs of the IC, translate the voltage levels of the input logic signals to the IC operating voltage levels; and, at the outputs of the IC, translate the voltage levels of the IC output logic signals back to the voltage levels with which the components off the IC operate.

In order to translate the generally higher voltage level logic signals employed by the circuitry off the IC to the generally lower voltage level IC logic signals, integrated circuits include a plurality of input buffers for converting each input signal applied to the IC. Similarly, a plurality of output buffers translates the plural lower voltage level logic IC signals back to the higher voltage level logic IC output signals. In translating these signals, each occurrence of a logical "0" and logical "1" voltage level in a higher level IC input signal is converted by an input buffer to a logical "0" and logical "1" voltage level, respectively, in a lower level signal. Similarly, an output buffer converts each occurrence of a logical "0" and logical "1" voltage level in the lower level IC signal to a logical "0" and logical "1" voltage level, respectively, in a higher level IC output signal. A buffer may not, however, instantaneously translate the transitions between logical "0" and logical "1" voltage levels at its input into corresponding transitions at its output. Furthermore, the propagation delay through a buffer of a transition from a low logical "0" voltage level to a high logical "1" voltage level is not likely to equal the propagation delay through that same buffer of a transition from a high logical "1" voltage level to a low logical "0" voltage level. As a result of this skew between the high-to-low and low-to-high propagation delays, the translated signal at the output of the buffer will be distorted in such a manner that the duration of a logical "0" or logical "1" pulse at the buffer output will be less than or greater than the corresponding pulses at the buffer input. For high-speed operations, such signal distortion can affect the ability of the circuitry on the IC and/or off the IC, to recognize the data bits. Buffer distortion can therefore limit the operating speed of the IC. Furthermore, such distortion is not readily eliminated a priori of manufacture since the magnitude of the distortion is not uniform from chip to chip, but is rather a variable, dependent upon processing, material, and enviromental conditions. As a result, a percentage of chips manufactured will have unacceptable performance characteristics at the desired operating speed, thereby reducing the usable yield of fabricated chips.

A high-speed logic level translator, disclosed in U.S. Pat. No. 4,305,009 to Y. Miyagawa et al., issued Dec. 8, 1981, speeds up the appearance of the level transition which is known a priori to be the slower of the two, using capacitive feed-forward techniques. Such a circuit will not eliminate the skew problem of an IC buffer where the low-to-high and high-to-low propagation delays are both variables, and there is no a priori knowledge of which transition is slower. In U.S. Pat. No. 4,314,166 to O. Bismarck, issued Feb. 2, 1982, a fast level shift circuit is disclosed which works as a translator to provide equal rise and fall times using a flip-flop memory element. The circuitry disclosed is moderately complex and may not perform satisfactorily at the high speeds where the asymmetry problems in buffers are the most severe.

The problem, then, is to devise a buffer arrangement for high-speed IC circuits that substantially reduces buffer distortion resulting from the difference in the low-to-high propagation delay with respect to the high-to-low propagation delay without any a priori knowledge of the sense or magnitude of that difference.

SUMMARY OF THE INVENTION

The buffer arrangement of the present invention employs the IC characteristic that buffers of the same type, and on the same bar, generally have the same distorting characteristics, i.e., the low-to-high and high-to-low propagation delays of one buffer will match the corresponding low-to-high and high-to-low propagation delay of a second buffer of that type on the same IC. In accordance with the present invention, the signal distortion resulting from the difference between the high-to-low propagation delay with respect to the low-to-high propagation delay, is eliminated by arranging distorting buffers on the IC into series-inverting pairs. The first distorting buffer of the pair inverts and predistorts the signal to be translated to yield a predistorted signal having timing distortion at each low-to-high transition due to either high-to-low or low-to-high propagation delay; and at each high-to-low transition, timing distortion due to the opposite type of propagation delay. The predistorted signal, when inverted and redistorted by a second buffer of the same type as the first, adds an additional propagation delay to each low-to-high transition and high-to-low transition opposite of the type imparted to that transition through the first distorting buffer. The propagation delay of each of the transitions in the translated signal at the output of the second buffer relative to the corresponding transitions in the original pretranslated signal are uniform and equal to the sum of the low-to-high plus the high-to-low buffer propagation delays. The output of the buffer arrangement is therefore a translated replica of the input signal, delayed by the sum of the low-to-high plus high-to-low propagation delays. Signal distortion is thus eliminated without any a priori knowledge of the magnitudes of either the low-to-high or high-to-low propagation delays of the buffers.

DETAILED DESCRIPTION

Figure 3:
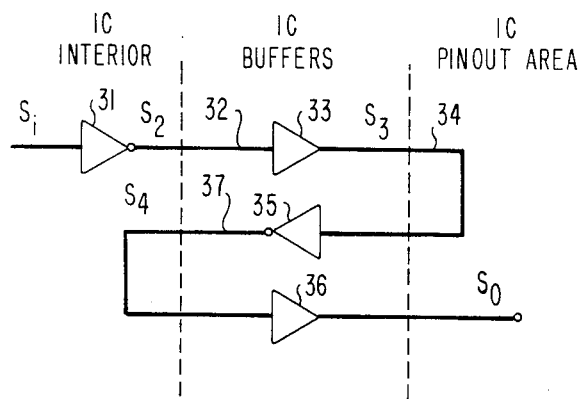
FIG. 3 shows one embodiment of an IC output buffer arrangement in accordance with the present invention.
Figure 7:
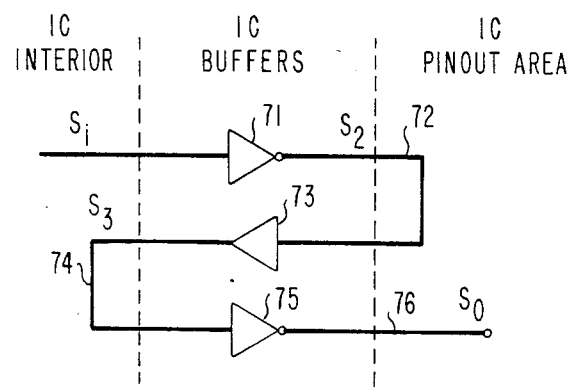
FIG. 7 shows a second embodiment of an IC output buffer arrangement in accordance with the present invention.

As described in detail hereinafter, the buffer arrangements in accordance with the present invention as shown in the embodiments of FIGS. 3 and 7, eliminate the signal distorting effects of IC output buffers which have been found by the inventor to be more likely than the input buffers to cause deleterious signal distortion. The principles of the present invention, however, can be equally applied to distorting input buffers.

Figure 1:
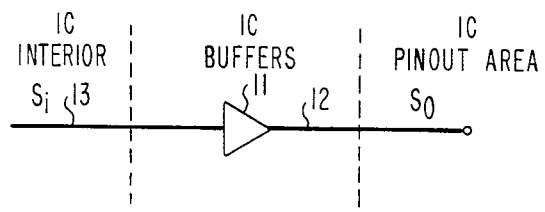
FIG. 1 shows a distorting prior art IC output buffer.

With reference to FIG. 1, distorting output buffer 11 translates a signal $S_i$ on lead 13 within the interior of the IC to signal $S_o$ on lead 12 on the IC pinout area from where it can be applied to other circuitry. Buffer 11 translates the logical "0" and "1" voltage levels within the IC to corresponding logical "0" and "1" voltage levels recognizable by the circuitry off the IC. For an IC using ECL (emitter-coupled logic) circuitry, a typical logical "0" voltage level would be approximately $-1.9$ volts; and a typical logical "1" voltage level would be approximately $-0.8$ volts. For TTL (transistor-transistor logic)-type output circuitry, a typical logical "0" voltage level for signal $S_o$ would be approximately 0.4 volts; and the corresponding logical "1" voltage level would be approximately 2.4 volts.

Figure 2:
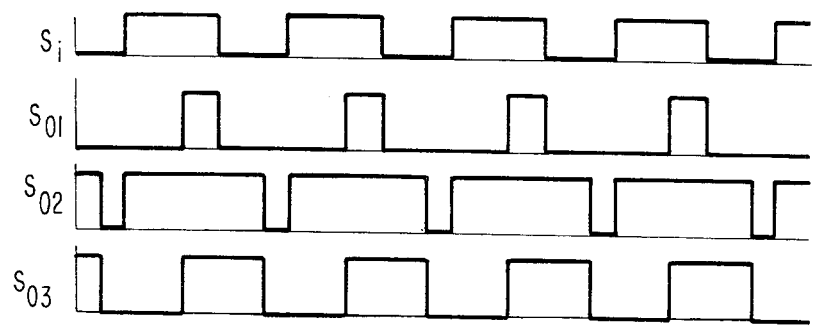
FIG. 2 shows the effect of various types of distortion on the output signal of the buffer in FIG. 1.

With reference to FIG. 2, signal $S_i$ is illustrative of a typical signal consisting of alternate logical "0's" and logical "1's". In order to simplify the drawings, all signal waveforms are shown voltage-shifted so that logical "0" is at zero volts, and logical "1" is at a positive potential. Signal $S_{o1}$ is the responsive translated signal when buffer 11 distorts the signal $S_i$ therethrough with a propagation delay at each low-to-high transition. As can be noted, the result of delaying each low-to-high transition is a distorted output signal $S_{o1}$ having narrower logical "1" pulse widths than signal $S_i$. Signal $S_{o2}$ is the responsive translated signal when buffer 11 distorts signal $S_i$ therethrough with a propagation delay at each high-to-low transition. As can be noted, the result of delaying each high-to-low transition is a distorted output signal $S_{o2}$ having narrower logial "0" pulse widths than signal $S_i$. Signal $S_{o3}$ is the responsive translated signal when buffer 11 distorts signal $S_i$ therethrough with a propagation delay at each low-to-high and high-to-low transition. In all cases, the buffer output is distorted from the input signal $S_i$ which, depending upon the frequency of the signal and the magnitude of the delay difference, can result in unsatisfactory performance.

With reference to FIG. 3, the buffer arrangement shown therein eliminates the distortion of an individual distorting buffer and produces an output signal $S_o$ which is a delayed and translated replica of the input signal $S_i$. An inverter 31 within the IC interior inverts the signal $S_i$ to be translated by the buffer arrangement. Signal $S_2$ on lead 32 at the output of inverter 31 is a nondistorted inverted replica of $S_i$. Inverted signal $S_2$ is predistorted by buffer 33 which translates the voltage levels of signal $S_2$ to produce a signal $S_3$, which may have a propagation delay of unknown magnitude at each level transition. The inverted and predistorted signal $S_3$ on lead 34 is re-inverted and retranslated back to IC signal levels on lead 37 by a nondistorting inverting input buffer 35. Due to the re-inversion of the distorted inverted signal, signal $S_4$ at the output of buffer 35 is a distorted version of signal $S_i$ having propagation delay at its low-to-high transitions due to the high-to-low propagation delay of buffer 33, and having a propagation delay at its high-to-low transitions due to the low-to-high propagation delay of buffer 33. This predistorted signal $S_4$ is translated back to output voltage levels by output buffer 36 of the same type, and on the same bar, as buffer 33. Buffers 33 and 36 therefore have the same characteristics and generally track each other such that the low-to-high transition propagation delays and the high-to-low propagation delays are buffer-to-buffer equivalent. Each low-to-high transition in signal $S_4$, which had been delayed by the high-to-low propagation delay of buffer 33, is further delayed by the low-to-high propagation delay of buffer 36. Similarly, each high-to-low transition in signal $S_4$, which had been delayed by the low-to-high propagation delay of buffer 33, is further delayed by the high-to-low propagation delay of buffer 36. Therefore, each transition in signal $S_o$ at the output of buffer 36 is equally delayed, relative to the corresponding transitions in signal $S_i$, by the sum of the low-to-high plus high-to-low propagation delays. Signal $S_o$ is thus delayed from signal $S_i$, but not distorted therefrom. This arrangement of distorting buffers in series-inverting pairs consisting of inverter 31 and distorting buffer 33, and inverting buffer 35 and distorting buffer 36, therefore eliminates the signal distortion of an individual buffer without any a priori knowledge of the magnitudes of the low-to-high and/or high-to-low propagation delays.

Figure 4:
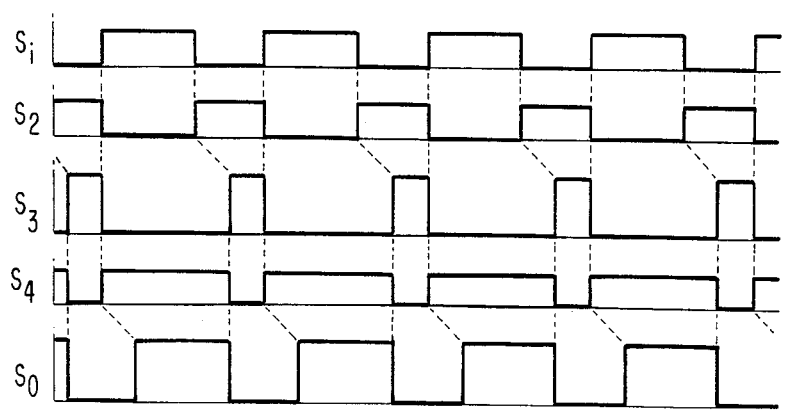
FIG. 4 shows the input, intermediate, and output signal waveforms of the buffer arrangement of FIG. 3 when the buffers have a propagation delay at only the low-to-high transitions.
Figure 5:
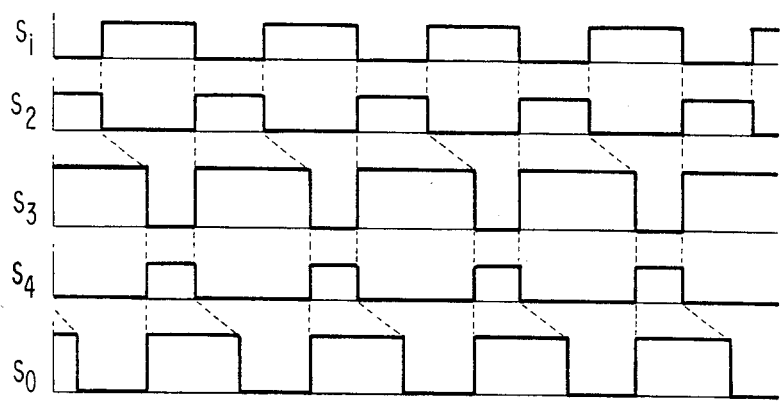
FIG. 5 illustrates the input, intermediate, and output signal waveforms of the buffer arrangement of FIG. 3 when the buffers have a propagation delay at only the high-to-low transitions.
Figure 6:
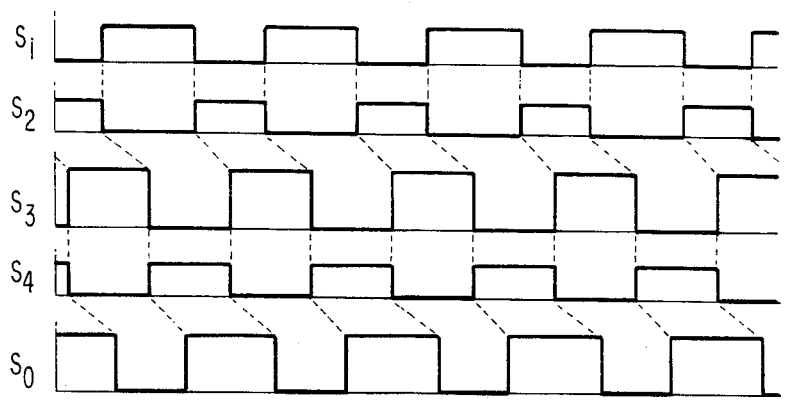
FIG. 6 shows the input, intermediate, and output signal waveforms of the buffer arrangement of FIG. 3 when the distorting buffers have a propagation delay at both the high-to-low and low-to-high transitions.

The waveforms in FIGS. 4, 5, and 6 show the signals through the buffer arrangement of FIG. 3 when the distorting buffers 33 and 36 delay only the low-to-high transitions, delay only the high-to-low transitions, and delay both transitions, respectively. With reference to FIG. 4, signal $S_i$ is a typical IC signal equivalent to signal $S_i$ in FIG. 2. Signal $S_2$ is a nondistorted inverted version of signal $S_i$. Buffer 33 delays each low-to-high transition of signal $S_2$ (which is each high-to-low transition of signal $S_i$) to yield predistorted signal $S_3$. Signal $S_4$ is a nondistorted translated and inverted replica of signal $S_3$. Buffer 36 delays each low-to-high transition of signal $S_4$ by the same delay which buffer 33 delays each low-to-high transition of signal $S_2$. Each transition in signal $S_o$ is thus equally delayed; and $S_o$, unlike signal $S_{o1}$ in FIG. 2, is a nondistorted translated replica of signal $S_i$.

With reference to FIG. 5, signals $S_i$ and $S_2$ are equivalent to signals $S_i$ and $S_2$ in FIG. 4. Buffer 33 delays each high-to-low transition of signal $S_2$ (which is each low-to-high transition of signal $S_i$) to yield predistorted signal $S_3$. Signal $S_4$ is a nondistorted inverted replica of signal $S_3$. Buffer 36 delays each high-to-low transition in signal $S_4$ by the same delay which buffer 33 delays each high-to-low transition of signal $S_2$. Signal $S_o$, unlike signal $S_{o2}$ in FIG. 2 is a nondistorted translated replica of signal $S_i$.

With reference to FIG. 6, signals $S_i$ and $S_2$ are equivalent to signals $S_i$ and $S_2$ in FIGS. 4 and 5. Buffer 33 delays each transition of signal $S_2$. Predistorted signal $S_3$, when inverted by buffer 35 and retranslated and distorted by buffer 36 yields signal $S_o$, which is uniformly delayed from signal $S_i$ by the sum of the high-to-low plus low-to-high propagation delays of the buffers.

With reference to FIG. 7, a second embodiment of a buffer arrangement in accordance with the present invention is shown. An inverting output buffer 71 both inverts and translates the interior IC signal $S_i$ to generate signal $S_2$ on lead 72. The logical "0" and logical "1" voltage levels in signal $S_i$ are translated by buffer 71 to logical "1" and logical "0" voltage leads in signal $S_2$, respectively. The high-to-low transitions in signal $S_2$ are delayed relative to the corresponding low-to-high transitions in signal $S_i$ due to the propagation delay of buffer 71 at the high-to-low transitions; and the low-to-high transitions in signal $S_2$ are delayed relative to the corresponding high-to-low transitions in signal $S_i$, due to the propagation delay of buffer 71 at the low-to-high transitions. This predistorted and inverted signal $S_2$ is translated by nondistorting input buffer 73 back to the interior IC voltage levels on lead 74. Signal $S_3$ is thus at the voltage levels of signal $S_i$, but is inverted and distorted therefrom. Signal $S_3$ is retranslated by inverting buffer 75 to produce output signal $S_o$ on lead 76 at the output voltage levels. Buffer 75 is the same type and on the same IC bar as buffer 71 and, therefore, has the same distortion characteristics. Buffer 75 translates the logical "0" levels of signal $S_3$ (and thus the IC logical "1" levels of signal $S_i$) to logical "1" output signal levels and the logical "1" levels of signal $S_3$ (and thus the IC logical "0" levels of signal $S_i$) to logical "0" output levels. The low-to-high transitions of signal $S_o$ are delayed relative to the corresponding high-to-low transitions in signal $S_3$ due to the propagation delay of buffer 75 at the low-to-high transitions, and the high-to-low transitions of signal $S_o$ are delayed relative to the corresponding low-to-high transitions in signal $S_3$ due to the propagation delay of buffer 75 at the high-to-low transitions. Therefore, each low-to-high transition in signal $S_o$ is delayed relative to the corresponding low-to-high transition in signal $S_o$ by the sum of the high-to-low propagation delays of buffer 71, plus the low-to-high propagation delay of buffer 75; and each high-to-low transition in signal $S_o$ is delayed relative to the corresponding high-to-low transition in signal $S_o$ by the sum of the low-to-high propagation delay of buffer 71, plus the high-to-low propagation delay of buffer 75. Since the distortion characteristics of buffers 71 and 75 are equivalent, all transitions in signal $S_o$ are delayed uniformly from their corresponding transitions in signal $S_i$; and signal $S_i$ is faithful in shape but delayed from signal $S_i$.

Figure 8:
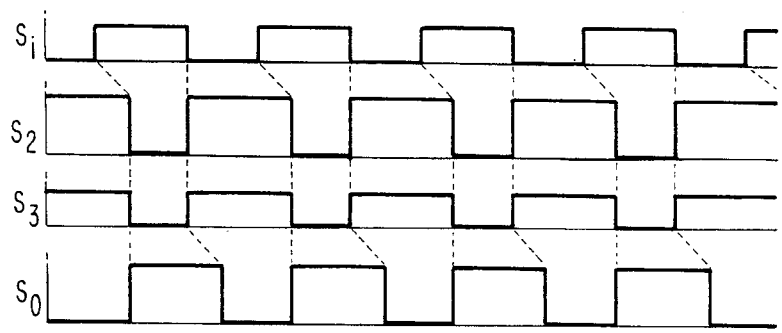
FIG. 8 shows the input, intermediate, and output signal waveforms of the buffer arrangement of FIG. 7 when the buffers have a propagation delay at only the high-to-low transitions.

The waveforms in FIG. 8 show the signals through the buffer arrangement of FIG. 7 when buffers 71 and 75 delay only the high-to-low transitions of the output signals thereof. With reference to FIG. 8, signal $S_i$ is the same typical IC signal previously used in FIGS. 2, 3, 5, and 6. Signal $S_2$ is the predistorted inverted voltage translated output signal of buffer 71 in which each high-to-low transition, corresponding to the low-to-high transitions of signal $S_i$, is delayed due to the propagation delay of that buffer. Signal $S_3$ is equivalent to signal $S_2$, but retranslated to IC voltage levels. Signal $S_o$ is the inverted, voltage-translated, and distorted output of buffer 75 generated in response to the $S_3$ input signal. As can be noted, each low-to-high transition in signal $S_o$ is delayed relative to the corresponding low-to-high transition in signal $S_i$ by the high-to-low propagation delay of buffer 71; and each high-to-low transition in signal $S_o$ is delayed relative to the corresponding high-to-low transition in signal $S_i$ by the high-to-low propagation delay of buffer 75. Therefore, for equal buffer-to-buffer propagation delays, signal $S_o$ is faithful in shape to signal $S_i$. The buffer arrangement shown in FIG. 7 will similarly eliminate the distortion due to only low-to-high propagation delay and both low-to-high and high-to-low propagation delay without any a priori knowledge of the magnitudes of either.

The above-described embodiments are illustrative of the principles and applications of the present invention. Other embodiments may be devised by those skilled in the art without departing from the spirit and scope of the invention.

What is claimed is:

1. A circuit arrangement on an integrated circuit for translating a first signal having first and second voltage levels to a second signal having third and fourth voltage levels, said integrated circuit including at least two buffers for translating signals having said first and second voltage levels to signals having said third and fourth voltage levels, each of said buffers having substantially the same distortion characteristic which results in a propagation delay at each transition from said third to said fourth voltage level and from said fourth to said third voltage level, said arrangement comprising first inverting and distorting means comprising one of said buffers for deriving from said first signal an inverted predistorted signal having said third and fourth voltage levels and having a propagation delay at each transition between said third and fourth voltage levels due to the third-to-fourth level or fourth-to-third level propagation delay of said one buffer, and second inverting and distorting means in series with said first inverting means and distorting means comprising a second of said buffers for inverting and redistorting said inverted predistorted signal to produce said second signal, said second buffer further delaying each of said transitions between said third and fourth voltage levels due to the third-to-fourth level or fourth-to-third level propagation delay of said second buffer, the total delay of each transition from said third to said fourth voltage level in said second signal being equal to the sum of said third-to-fourth level propagation delay of one of said two buffers and the fourth-to-third level propagation delay of the other of said two buffers, the total delay of each transition from said fourth to said third voltage level in said second signal being equal to the sum of said third-to-fourth level propagation delay of said other of said two buffers plus the fourth-to-third level propagation delay of said one of said two buffers, said sums being substantially equal.

2. A circuit arrangement in accordance with claim 1 wherein said second inverting and distorting means further comprises means for translating said inverted distorted signal having said third and fourth voltage levels to a signal having said first and second voltage levels.

3. A circuit arrangement on an integrated circuit for translating a first signal having first and second voltage levels to a second signal having third and fourth voltage levels, said integrated circuit including at least two buffers for translating signals having said first and second voltage levels to signals having said third and fourth voltage levels, each of said buffers having substantially the same distortion characteristic which results in a propagation delay at each transition from said third to said fourth voltage levels and from said fourth to said third voltage levels, said arrangement comprising first means for deriving from said first signal through one of said buffers a predistorted signal having said third and fourth voltage levels and having at each transition between said third and fourth voltage levels with respect to the corresponding transition in said first signals a delay due to the third-to-fourth level or fourth-to-third level propagation delay of said one buffer, and second means for deriving from said predistorted signal through second buffer said second signal having said third and fourth voltage levels and having at each transition between said third and fourth voltage levels with respect to the corresponding transition in said first signal a delay equal to either the sum of the third-to-fourth level propagation delay of one of said two buffers plus the fourth-to-third level propagation delay of the other of said two buffers or to the sum of the third-to-fourth level propagation delay of said other of said two buffers plus the fourth-to-third level propagation delay of said one of said buffers, said sums being substantially equal.

4. A circuit arrangement on an integrated circuit for translating a first signal having first and second voltage levels to a second signal having third and forth voltage levels, said integrated circuit including at least two buffers for translating signals having said first and second voltage levels to signals having said third and fourth voltage levels, each of said buffers having the same distortion characteristic which delays each transition from said third to said fourth voltage levels with respect to a corresponding transition between said first and second levels by a third-to-fourth level propagation delay, and which delays each transition from said fourth to said third voltage levels with respect to a corresponding transition between said first and second levels by a fourth-to-third level propagation delay, said arrangement comprising means for developing through said first buffer from said first signal a predistorted signal having said third and fourth voltage levels and having a delay at each transition from said third-to-fourth voltage levels and from said fourth-to-third voltage levels due to the third-to-fourth and fourth-to-third level propagation delays of said first buffer, respectively, means for translating said predistorted signal to a signal having said first and second voltages, and means for developing through said second buffer said second signal from said translated predistorted signal, said second signal having at each transition from said third to fourth voltage levels relative to the corresponding transition in said first signal a delay equal to the sum of the third-to-fourth propagation delay of one of said two buffers plus the fourth-to-third propagation delay of the other of said two buffers, and having a delay at each transition from said fourth-to-third voltage levels relative to the corresponding transition in said first signal equal to the sum of the fourth-to-third propagation delay of said one of said buffers plus the third-to-fourth propagation delay of said other buffer, said sums being substantially equal.

5. A circuit arrangement on an integrated circuit for translating a first signal having first and second voltage levels to a second signal having third and fourth voltage levels, said integrated circuit including at least two buffers for translating signals having said first and second voltage levels to signals having said third and fourth voltage levels, each of said buffers having substantially the same distortion characteristic which results in a propagation delay at each transition from said third to said fourth voltage levels and from said fourth to said third voltage levels, said arrangement comprising means for inverting said first signal, a first of said buffers for translating said inverted signal into a predistorted signal having said third and fourth voltage levels and having a propagation delay at each transition from said third to said fourth voltage levels and from said fourth to said third voltage levels due to the third-to-fourth level and fourth-to-third level propagation delay, respectively, of said first buffer, means for inverting and translating said predistorted signal to a signal having said first and second voltages and having a delay at each transition between said first and second voltage levels due to said third-to-fourth-and fourth-to-third levels propagation delay of said first buffer, and a second buffer for translating the signal at the output of said inverting and translating means to produce said second signal at said third and fourth voltage levels, each transition from said third to said fourth voltage levels in said second signal having a total delay equal to the sum of the fourth-to-third level propagation delay of said first buffer plus the third-to-fourth level propagation delay of said second buffer, each transition from said fourth to said third voltage levels in said second signal having a total delay equal to the sum of the third-to-fourth level propagation delay of said first buffer plus the fourth-to-third level propagation delay of said second buffer, said sums being substantially equal.

* * * * *